United States Patent [19]

Pizzarello

[11] Patent Number: 4,498,156
[45] Date of Patent: Feb. 5, 1985

[54] ELECTROCHROMIC NONVOLATILE MEMORY DEVICE

[75] Inventor: Frank A. Pizzarello, Yorba Linda, Calif.

[73] Assignee: Rockwell International Corporation, El Segundo, Calif.

[21] Appl. No.: 305,248

[22] Filed: Sep. 24, 1981

[51] Int. Cl.³ .............e.................... G11C 13/04
[52] U.S. Cl. ..................... 365/215; 350/DIG. 1; 365/107
[58] Field of Search ......... 340/785; 350/357, DIG. 1; 365/64, 215, 234, 183, 127, 106, 107, 110, 111

[56] References Cited

U.S. PATENT DOCUMENTS

| 3,518,634 | 6/1970 | Ballman et al. | 365/215 |
| 3,868,658 | 2/1975 | Kiemle | 365/215 |
| 4,075,610 | 2/1978 | Crandall et al. | 365/107 |
| 4,184,751 | 1/1980 | Nicholson | 350/357 |
| 4,228,431 | 10/1980 | Barclay et al. | 350/357 X |

Primary Examiner—Joseph A. Popek
Attorney, Agent, or Firm—H. Fredrick Hamann; S. Alfred Uchizono

[57] ABSTRACT

Apparatus for storing and retrieving data, comprising a plurality of electrochromic cells having electrically controllable illumination transparency, a voltage source coupled to each electrochromic cell to provide control and bias signals thereto for electrically controlling the illumination transparency of selected ones of the cells in accordance with data to be stored, a light source providing flood illumination upon the plurality of electrochromic cells, and a charge transfer device comprising a plurality of charge transfer device cells for photodetecting illumination from the light source which passes through the then transparent electrochromic cells to effect the retrieval of data stored in the transparency of the plurality of electrochromic cells.

13 Claims, 3 Drawing Figures

ELECTROCHROMIC NONVOLATILE MEMORY DEVICE

The invention described herein was made in the course of or under a contract or subcontract thereunder with the Department of the Navy.

BACKGROUND OF THE INVENTION

This invention relates to an apparatus for the electro-optical storage and retrieval of data wherein the transparency state of each of an array of electrochromic cells is selectively encoded corresponding to data to be stored and, subsequent to which the data is retrieved by illuminating the array from one side and cooperatively photodetecting the passed illumination on the other side using an array photodetector.

THE BACKGROUND ART

Electrochromic devices are known in the art and the use of these devices as memory devices has been suggested. Also, array photodetectors are known in the art. However, none of the prior art teaches the concept of combining the capability of varying the transparency state of individual cells in a cellular electrochromic array with the spatial light pattern detection capability of photodetector arrays to produce an electro-optical data storage and retrieval apparatus. In U.S. Pat. No. 3,952,290 to Williams, there is disclosed a read only optical memory system comprising a mask encoded with a spatial pattern of varying opaqueness, a light source on one side of the mask projecting light towards the mask, and a pattern discriminating charge coupled photodetector device on the side of the mask opposite the source in projected alignment with the mask and with the light rays emanating from the light source. Williams is distinguished from the present invention in that the read only limitation is absent in the present invention. The present invention permits the erasure of stored data and the replacement of that data with new data as desired with little delay. In U.S. Pat. No. 3,428,396 to Megla et al., the storage medium is photochromic as distinguished from the electrochromic storage medium of the present invention. The photochromic memory disclosed in U.S. Pat. No. 3,550,096, to Alphonse et al., is likewise distinguished. In U.S. Pat. No. 3,496,662 to Choate, the bistable device disclosed therein has thermochromic and electrothermal characteristics as distinguished from electrochromic characteristics. Electrochromic display devices are disclosed in U.S. Pat. Nos. 4,019,809 to Otake, et al., 4,228,431 to Barclay, et al., and 4,146,876 to Arellano, et al, but none of these appear to teach the use of the storage capacity of the electrochromic device in conjunction with a photo-detector to form a storage and readout apparatus.

SUMMARY OF THE INVENTION

It is accordingly an object of the present invention to provide an apparatus for the storage and retrieval of data. It is a further object of the invention to provide a data storage and retrieval apparatus to encode the transparency states of a plurality of electrochromic cells to store the desired data. It is a still further object of the invention to provide for the electrical control of the electrochromic cell transparency in response to an applied voltage across the cell. It is also a further object of the invention to retrieve the data so stored in the transparency states of the individual cells by providing a photodetector array arranged and operated to detect and make available for decoding, the encoded data pattern stored in the electrochromic cell array. It is a further object of the invention to provide for electrochromic cells using electrochromic material suitable for high density and ease of fabrication. It is a still further objective of this invention to provide such a photodectector array type which is compatible both in performance and ease of fabrication with that of the electrochromic cell type provided in the invention.

These and other objects of the invention are achieved in accordance with the teachings herein in an apparatus for storing and retrieving data, comprising a plurality of electrochromic cells having electrically controllable illumination transparency, means determining the illumination transparency of selected ones of the cells in data storing relation, and a charge transfer device comprising a plurality of charge transfer device cells for photodetecting illumination passed by the selected electrochromic cells in stored data retrieving relation.

Typically, the plurality of electrochromic cells is arranged in a common plane, e.g., arrayed in successive ranks and files. Generally, the composition of the electrochromic cells comprises lutetium diphthalocyanine. Also, means electrically controlling the illumination transparency generally comprises a voltage source coupled to each electrochromic cell to provide control and bias signals thereto, and typically is adapted to encode the electrochromic cells in binary relation. Desirably, the apparatus also includes a light source, the plurality of electrochromic cells being spatially arranged for simultaneous illumination by the light source.

Typically, the charge transfer device cells are divided into individual sets comprising at least one device cell, each set arranged to individually cooperate with individual ones of the electrochromic cells. More particularly, the plurality of electrochromic cells and the cooperating sets of charge transfer device cells are generally arranged in respective common planes, the planes being substantially parallel. Typically, this plurality of electrochromic cells and these sets of charge transfer device cells are oppositely arranged in ranks and files. In a further particularized embodiment, the means electrically controlling the illumination transparency comprises a voltage source coupled to each electrochromic cell to provide control and bias signals thereto, where typically, this voltage source is adapted to encode the electrochromic cells in binary relation. In an even further particularized embodiment there is preferably included a light source wherein the electrochromic cells are spatially arranged for simultaneous illumination by this light source and where in preferred instances the composition of the electrochromic cells comprises lutetium diphthalocyanine.

In another embodiment of the present invention, there is provided an apparatus for storing and retrieving data comprising: a plurality of electrochromic cells arranged in ranks and files in a common plane for illumination by a spectrally narrow-band light source, each electrochromic cell comprising a transparent solid electrode, a conductive liquid common to all of the plurality of electrochromic cells, a further electrode in contact with the liquid, and an electrochromic material in contact with the liquid and interposed between the liquid and the transparent electrode in electrochromic cell defining relation; a voltage supply coupled to the electrodes for selectively supplying a voltage to individual electrochromic cells in binary illumination transparency determining relation to store data in a prescribed format; a charge transfer device comprising sets of charge transfer device cells, each set individually paired with an electrochromic cell; and a voltage supply for providing control and bias signals coupled to the charge transfer device, whereby narrow-band illumination received from the common light source passes through these electrochromic cells in a voltage induced transparent state, and generates photo-induced charge carriers in the sets of charge transfer device cells in data retrieving relation corresponding to the prescribed format of transparency in the plurality of electrochromic cells.

BRIEF DESCRIPTION OF THE DRAWINGS

The invention will be further described as to an illustrative embodiment in conjunction with the attached drawings in which.

DESCRIPTION OF THE PREFERRED EMBODIMENTS

Figure 1:
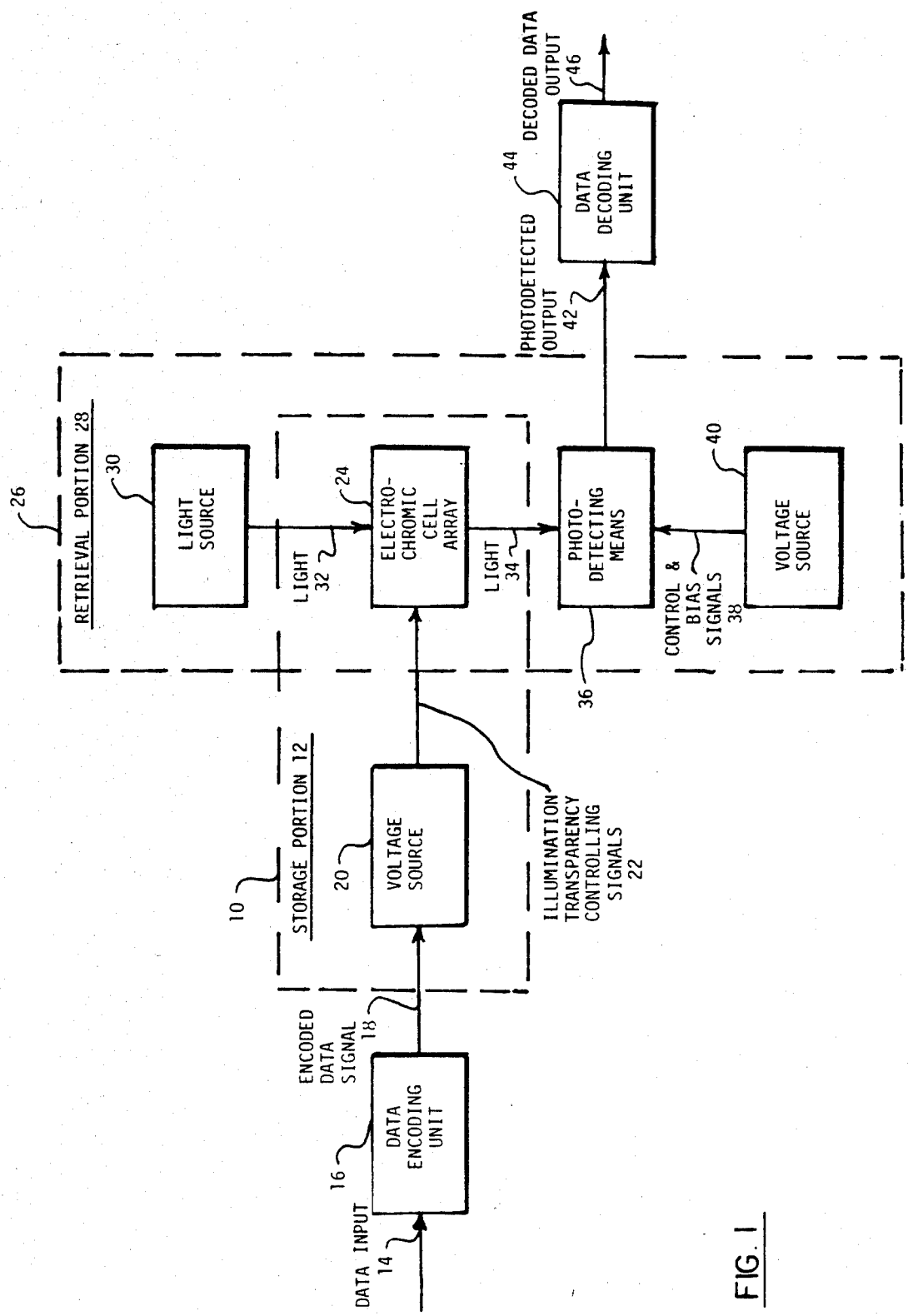
FIG. 1 is a block diagram of a data storage and retrieval system illustrating the functional aspects of the apparatus for storing and retrieving data according to the present invention.

Turning now to the drawings, there is shown in FIG. 1 a block diagram of a data storage and retrieval system illustrating the functional aspects of the apparatus for storing and retrieving data according to the present invention. There are shown enclosed within a dashed border 10, the main elements of the storage portion 12 of the system, including the voltage source 20 responsive to the encoded signal 18, and the electrochromic cell array 24 responsive to the illumination transparency controlling signals 22. Where the data to be stored is not available in a properly encoded form, an encoding unit 16 can be added between the data input 14 and the voltage source 20. When used by itself and also when combined with the data encoding unit 16, the voltage source 20 falls within the category of elements, referred to elsewhere herein, as means electrically controlling the illumination transparency of selected ones of the electrochromic cells in data storing relation. Also shown in a second dashed enclosed 26 is the retrieval portion 28 of the system which includes the light source 30, the electrochromic cell array 24 illuminated by the light 32 from the light source, photodetecting means 36 for producing the photodetected output 42 responsive to light 34 passed by the electrochromic cell array, and voltage source 40 to provide control and bias signals 38 to operate the photodetecting means. When additional signal processing is required to retrieve the data from the photodetected output 42, a data decoding unit 44 can be employed at the output of the photodetecting means 36 to produce the decoded data output 46. Collectively, the photodetecting means 36 and the voltage source 40 are indentified elsewhere herein as means adapted for photodetecting illumination passed by the selectively transparent electrochromic cells in stored data retrieving relation. Note that the one common element between the storage portion 12 and the retrieval portion 28 of the system is the electrochromic cell array 24.

The operation of the storage and retrieval system is divided into two main functions, the store or write function and the retrieve or read function. These functions are carried out by the two portions of the system describd above, the storage portion 12, and the retrieval portion 28, peripherally aided by the data encoding unit 16 and data decoding unit 44 as the case requires. The memory unit in this storage and retrieval system is the electrochromic cell array 24. Information is stored in the spectral transparency state of individual cells making up the array 24. The spectral transparency state of each of the electrochromic cells of the array 24 is alterable from one state to another state by the application of a voltage across the cell. These voltages correspond to the illumination transparency controlling signal 22 coupled from the voltage source 20. In a first transparency state, the quiescent state, corresponding, for example, to a logic zero, an individual electrochromic cell is opaque to a selected narrow-band spectrum of light corresponding to the red wavelength portion of the optical spectrum. In a secondary transparency state, the activated state, induced by the application of a potential across the electrochromic cell, the cell is now made transparent to the narrow-band red light. In this activated state corresponding to a logic one condition, for example, the transparency state will remain on the electrochromic cells for extended periods of time, even upon removal of the illumination frequency controlling potential. This transparency retentivity allows the nonvolatile storage of data in the transparency state of individual cells. Reset to the ground state is carried out by the application of a low reverse voltage.

After storage, the data may be retrieved later as desired by reading out the transparency state of the cells. This is accomplished by using the retrieval portion 28 of the system, wherein the electrochromic cell array 24 is flood illuminated by light rays 32 projected from the light source 30, which in this example emits the red light that is spectrally compatible with the quiescent (opaque) state/activated (transparent) state characteristic of the electrochromic cells. On the side of the electrochromic cell array 24 opposite the light source 30, the optically aligned and registered photodetecting means 36 is positioned comprising a plurality of photodetector elements each of which is paired in a one-to-one relationship to a corresponding electrochromic cell. In accordance with the information stored in the transparency state of the electrochromic cells, red light 32 leaving source 30 which is incident on those activated (transparent) electrochromic cells 24 is then photodetected by the corresponding paired photodetector elements 36. The photodetected output 42 is then coupled to the data decoding unit 44 to decode and demultiplex the data output 46. The control and bias signals 38 necessary for operation of the photodetector elements are provided by the voltage source 40.

In summary, then, the data input 14 is stored in the electrochromic cells during the write time, and is retrieved at a later time by photodetecting the light source illumination 34 which has passed through the electrochromic cells 24, detected by the photodetector 36, decoded by the decoding unit 44 with the decoded data output provided at 46.

Figure 2:
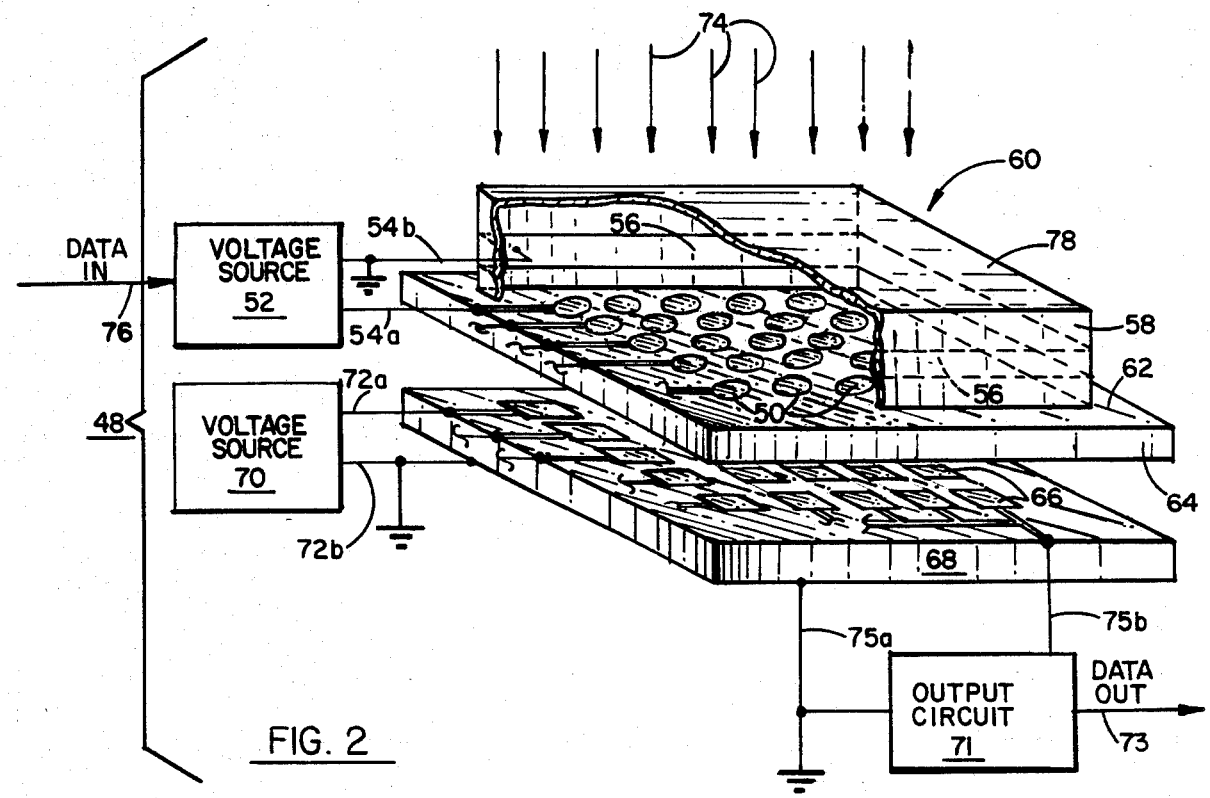
FIG. 2 is a perspective view enlarged and somewhat exaggerated showing the apparatus of the present invention.

Turning now to FIG. 2, there is shown a perspective view of an apparatus 48 for storing and retrieving data in accordance with the present invention. Shown in the figure is a plurality of electrochromic cells 50 wherein each of said cells has an electrically controllable illumination transparency. In the arrangement shown, the electrochromic cells 50 are arranged in a common plane. The cells 50 are also arrayed in successive ranks and files in an orderly organization.

In a preferred embodiment of the invention, the individual electrochromic cells 50 are comprised of lutetium diphthalocyanine. Also shown is the voltage source 52 which provides the necessary potential for controlling the transparency state of the individual electrochromic cells 50. The selective application of voltage across each individual cell 50 is provided through leads 54a, 54b to individual electrodes (not shown) on each cell and to one electrode 56 common to all cells through the medium of an enclosed liquid electrolyte (not shown) which is in conductive contact with each cell. The electrode 56 is attached to the interior of the sidewalls 58 of the cavity 60 which along with the upper surface 62 of the electrochromic cell substructure 64 combines to enclose the electrolyte. By application of a suitable voltage across the leads 54a and 54b by the voltage source 52, the transparency state of those cells 50 which have voltage placed across them will experience a change in the transparency state with respect to a selected narrow-band spectrum of light. Typically, for lutetium diphthalocyanine, the quiescent or no voltage state corresponds to the electrochromic cell 50 being opaque to light in the red wavelength portion of the spectrum. With the application of a voltage on the order of five volts, the transparency state of each of the individual cells 50 is altered to provide transparency to wavelengths in the red wavelength portion of the spectrum. The group of elements including the array of photodetector elements 66, structure 68 supporting the photodetector elements, and the voltage source 70 with control and bias signals coupled to the photodetector elements through leads 72a and 72b comprise collectively what is referred to elsewhere herein as the means adapted for photodetecting illumination 74 passed by the electrochromic cells 50.

As previously indicated, the two major functions of the apparatus 48 are the store or write function, and the retrieve or read function. The basic operation of the apparatus 48 shown on FIG. 2 in a write function capacity is as follows: the data to be stored is provided to the voltage source 52 at the data input 76. This input data is interpreted and processed by the voltage source 52 and applied to the electrochromic cells 50 through the leads 54a and 54b in accordance with the encoding which attends to the data input 76. Each of the electrochromic cells 50 will remain in its quiescent state corresponding, for example, to a logic zero condition or be altered by the application of a voltage across the cell to a second transparency state corresponding to a logic one condition. The voltage may now be removed and data thus stored in the transparency pattern of the electrochromic cell array will be retained in the array for periods of approximately a week, without being refreshed. At a later time when the data is to be recalled or retrieved, a light source (not shown) is made to provide illumination 74 which is incident on the top wall 78 of the cavity 60. The top wall 78 is transmissive to the incoming light rays 74 and allows the light rays to impinge the electrochromic cells 50. With the use of red light, those electrochromic cells 50 which have been altered by a potential across them will be transparent to the light, thereby allowing the light rays 74 incident on the surface of those transparent cells to pass on through the structure 68 and proceed on to the photodetector plane surface 80. Those electrochromic cells 50 which have less than a transparency altering potential across them, will thereby block the red light from passing through to the photodetector plane surface 80. The electrochromic cells 50 are arrayed in ranks and files and are registered and aligned on a one-to-one basis to corresponding photodetector elements 66. Those electrochromic cells 50 which are transparent to the red light 74 will thereby allow the photodetector 66 to receive the red light signal, thereby allowing photodetection of the red light to occur in accordance with the transparent state of the electrochromic cell aligned with it. The photodetected signal thus appearing in the array of photodetector elements 66 is then accessed with the application of appropriate control and bias signals supplied by the voltage source 70 through connections 72a and 72b. The format of the data output from the array of detector elements 66 depends on the type of photodetector employed. The data out 73 is represented at the output of the output circuit 71 to which the photodetected signal is coupled through leads 75a and 75b.

Figure 3:
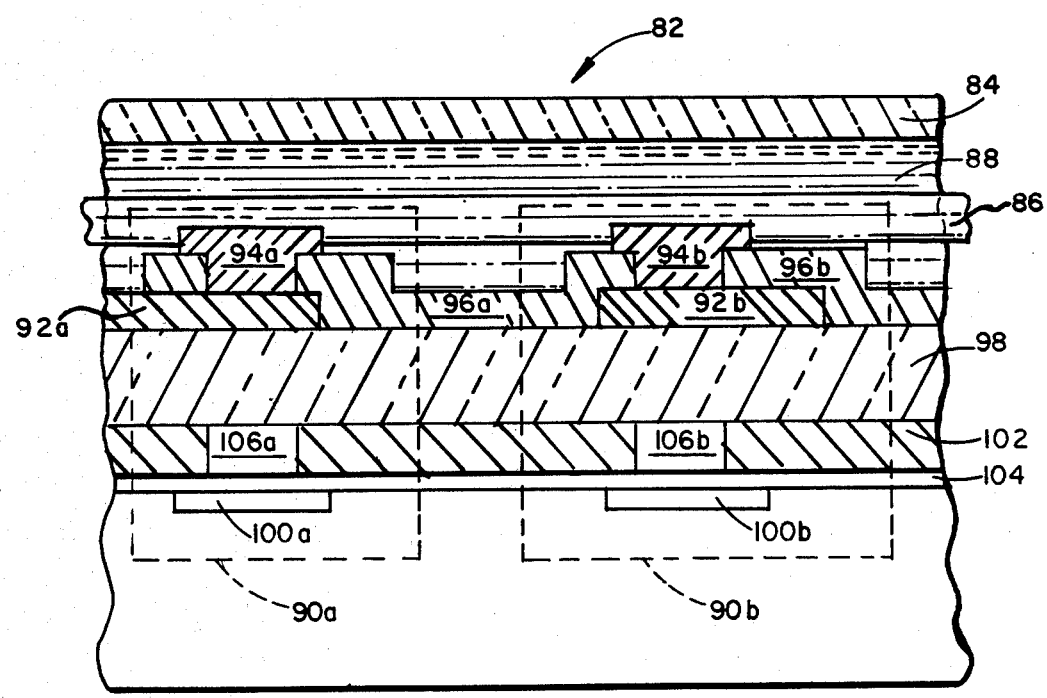
FIG. 3 is a fragmentary side elevational view greatly enlarged and somewhat exaggerated taken in a plane perpendicular to the plane of the array of electrochromic cells of the present invention.

Turning now to FIG. 3, there is shown a cross sectional view of a portion of the storage and retrieval apparatus structure 82 in accordance with the present invention. The dimensions are exaggerated to demonstrate the detailed characteristics of the structure 82. Shown is the glass layer 84 which forms a portion of the top wall of the cavity used to enclose the electrolyte liquid 88. Shown also is the electrode 86 (corresponding to electrode 56 in FIG. 2), sometimes referred to as the counter electrode, which serves as the electrode common to all the electrochromic cells wherein the conductive path to each cell from the counter electrode is provided through the electrolyte liquid 86. Bordered by the dashed enclosures 90a and 90b are the elements peculiar to adjacent electrochromic cell/ohotodetector element pairs. Individually, the transparent electrodes 92a, 92b in combination with the counter electrode 88, provide a pair of electrodes to each electrochromic cell, across which voltage is applied to alter the transparency state of the electrochromic material, 94a and 94b respectively. The electrodes 92a, 92b as well as the other individual electrodes (not shown) associated with the other electrochromic cells making up the array, are electrically isolated from each other by typical insulators 96a, 96b.

The supporting substrate 98 is comprised of a transparent nonconductive glass providing structural support for each individual electrochromic cell as well as being transparent to the readout light source spectrum.

Typical of the type of electrochromic material used is lutetium diphthalocyanine, which upon application of an appropriate potential, for example, between electrode 92a and the counter electrode 88, will alter its transparency, thereby serving to act as a shutter with reference to light which is proceeding from the top of the structure down towards the bottom. The light so allowed to pass through the electrochromic material 94a will pass through to the photodetector element 100a. Layer 102, having apertures 106a, 106b, is an opaque insulating mask plate between the glass substrate 98 and the air gap 104, for limiting the optical cross-talk between adjacent electrochromic cell/detector element pairs. This then is the general structure of the electrochromic cells/photodetector element pairs which are registered and aligned to each other, characterized by the controlled transparency lutetium diphthalocyanine portions 94a, 94b.

Thus, the foregoing objects, including the object to provide an apparatus for the storage and retrieval of data and the further object to provide a data storage and retrieval apparatus to encode the transparency state of a plurality of electrochromic cells to store the desired data are achieved by these embodiments of the invention through the novel approach using electrochromic cells as described above.

Although the invention has been described and illustrated in detail, it is to be clearly understood that the same is by way of illustration and example only and is not be taken by way of limitation, the spirit and scope of this invention being limited only by terms of the appended claims, wherein:

What is claimed is:

1. Apparatus for storing and retrieving data, comprising:
    a plurality of electrochromic cells having electrically controllable illumination transparency;
    means electrically controlling the illumination transparency of selected ones of said cells in accordance with data to be stored;
    a light source which projects a flood illumination upon said plurality of electrochromic cells during data retrieval; and
    a charge transfer device comprising a plurality of charge transfer device cells for photodetecting illumination from said light source and passed by said selected electrochromic cells onto said charge transfer device to effect retrieval of data stored in the illumination transparency of said plurality of electrochromic cells.

2. Apparatus according to claim 1, in which said plurality of electrochromic cells is arranged in a common plane.

3. Apparatus according to claim 2, in which said plurality of electrochromic cells is arrayed in successive ranks and files in said common plane.

4. Apparatus according to claim 1, in which the composition of said electrochromic cells comprises lutetium diphthalocyanine.

5. Apparatus according to claim 1, in which said means electrically controlling the illumination transparency comprises a voltage source coupled to each electrochromic cell to provide control and bias signals thereto.

6. Apparatus according to claim 1, in which said means electrically controlling the illumination transparency is adapted to encode said cells in binary relation.

7. Apparatus according to claim 1, in which said plurality of charge transfer device cells are divided into individual sets comprising at least one device cell, said sets arranged to individually cooperate with individual ones of said electrochromic cells.

8. Apparatus according to claim 7, in which said plurality of electrochromic cells and said cooperating sets of charge transfer device cells are arranged in respective common planes, said planes being substantially parallel.

9. Apparatus according to claim 8, in which said plurality of electrochromic cells and sets of charge transfer device cells are oppositely arrayed in successive ranks and files.

10. Apparatus according to claim 9, in which said means electrically controlling the illumination transparency comprises a voltage source coupled to each electrochromic cell to provide control and bias signals thereto.

11. Apparatus according to claim 10, in which said electrochromic cell voltage source is adapted to encode said cells in binary relation.

12. Apparatus according to claim 11, in which the composition of said electrochromic cells comprises lutetium diphthalocyanine.

13. Apparatus for storing and retrieving data, comprising:
    a plurality of electrochromic cells arranged in ranks and files in a common plane for illumination by a spectrally narrow-band light source, each said electrochromic cell comprising a transparent solid electrode, a conductive liquid common to all said plurality of electrochromic cells, a further electrode in contact with said liquid, and an electrochromic material in contact with and interposed between said liquid and said transparent electrode in electrochromic cell defining relation;
    a voltage supply coupled to said electrodes for selectively supplying a voltage to individual electrochromic cells in binary illumination transparency determining relation to store data in a prescribed format;
    and a charge transfer device comprising sets of charge transfer device cells, each set individually paired with an electrochromic cell;
    and a voltage supply for providing control and bias signals coupled to said charge transfer device;
    whereby narrow-band illumination received from said light source passes through those electrochromic cells in a voltage induced transparent state and generates photo-induced charge carriers in said sets of charge transfer device cells in data retrieving relation corresponding to said prescribed format of transparency in said plurality of electrochromic cells.

* * * * *

UNITED STATES PATENT AND TRADEMARK OFFICE
CERTIFICATE OF CORRECTION

PATENT NO. : 4,498,156
DATED : February 5, 1985
INVENTOR(S) : Frank A. Pizzarello It is certified that error appears in the above-identified patent and that said Letters Patent are hereby corrected as shown below:

Column 2, line 15, please change the word "determining" to read ---electrically controlling---.

Column 2, line 42, please change the word "arranged" to read ---arrayed---.

Column 3, line 58, please change the word "When" to read ---Where---.

Column 4, line 30, please change the word "frequency" to read ---transparency---.

Column 5, line 51, please delete the word "to".

Signed and Sealed this

Second Day of July 1985

[SEAL]

Attest:

DONALD J. QUIGG

Attesting Officer     Acting Commissioner of Patents and Trademarks